(12) United States Patent
Alla et al.

(10) Patent No.: US 11,316,455 B2
(45) Date of Patent: Apr. 26, 2022

(54) GENERATOR ROTOR TURN-TO-TURN FAULT DETECTION USING FRACTIONAL HARMONICS

(71) Applicant: Schweitzer Engineering Laboratories, Inc., Pullman, WA (US)

(72) Inventors: Matchyaraju Alla, Pullman, WA (US); Ritwik Chowdhury, Charlotte, NC (US); Normann Fischer, Colfax, WA (US); Dale S. Finney, Little Bras D'or (CA); Rogerio Scharlach, Sandy Springs, GA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 10 days.

(21) Appl. No.: 17/003,477

(22) Filed: Aug. 26, 2020

(65) Prior Publication Data

US 2021/0067072 A1 Mar. 4, 2021

Related U.S. Application Data

(60) Provisional application No. 62/892,731, filed on Aug. 28, 2019.

(51) Int. Cl.
*H02P 9/00* (2006.01)
*G01R 31/62* (2020.01)
(Continued)

(52) U.S. Cl.
CPC ............ *H02P 9/006* (2013.01); *G01R 19/252* (2013.01); *G01R 31/62* (2020.01); *H02P 9/02* (2013.01)

(58) Field of Classification Search
CPC ......... G01R 31/34; G01R 19/02; B60L 15/00; H02J 3/00; H02M 1/00; H02M 7/00;
(Continued)

(56) References Cited

U.S. PATENT DOCUMENTS 2,881,319 A 4/1959 Sills
3,727,123 A 4/1973 Smith
(Continued)

FOREIGN PATENT DOCUMENTS

CN 103424622 A * 12/2013
CN 103293437 4/2016
(Continued)

OTHER PUBLICATIONS

Rik Pintelon, Johan Schoukens, System Identification: A Frequency Domain, Section 4.3 (pp. 119-131), Jan. 1, 2001.
(Continued)

*Primary Examiner* — Said Bouziane
(74) *Attorney, Agent, or Firm* — Richard M. Edge

(57) ABSTRACT

Detection and protection against electric power generator rotor turn-to-turn faults, rotor multi-point-to-ground faults, and rotor permanent magnet faults is provided herein. A fractional harmonic signal is used to determine the rotor fault condition. The fractional harmonic signal may be a fractional harmonic magnitude of the circulating current of one phase. The fractional harmonic may be a fractional harmonic magnitude of a neutral voltage. A tripping subsystem may issue a trip command based upon detection of a rotor turn-to-turn fault condition.

20 Claims, 12 Drawing Sheets

(51) Int. Cl.
   *G01R 19/252* (2006.01)
   *H02P 9/02* (2006.01)
(58) Field of Classification Search
   CPC .......... H01F 36/00; H01F 21/00; H01F 27/42;
               H01F 30/16; H02P 23/26; H02P 13/00
   See application file for complete search history.

(56) References Cited

U.S. PATENT DOCUMENTS

| | | |
|---|---|---|
| 3,973,171 A | 8/1976 | Howell |
| 4,000,464 A | 12/1976 | Nussel |
| 4,001,646 A | 1/1977 | Howell |
| 4,029,951 A | 6/1977 | Berry |
| 4,066,950 A | 1/1978 | Rumold |
| 4,148,087 A | 4/1979 | Phadke |
| 4,159,499 A | 6/1979 | Breskin |
| 4,161,011 A | 7/1979 | Wilkinson |
| 4,206,398 A | 6/1980 | Janning |
| 4,245,182 A | 1/1981 | Aotsu |
| 4,321,643 A | 3/1982 | Vernier |
| 4,371,832 A | 2/1983 | Wilson |
| 4,511,811 A | 4/1985 | Gupta |
| 4,542,468 A | 9/1985 | Taniguti |
| 4,556,946 A | 12/1985 | Taniguti |
| 4,558,309 A | 12/1985 | Antonevich |
| 4,667,263 A | 5/1987 | Morris |
| 4,763,057 A | 8/1988 | Danz |
| 4,820,991 A | 4/1989 | Clark |
| 4,825,327 A | 4/1989 | Alexander |
| 4,851,758 A | 7/1989 | Ostada |
| 4,939,506 A | 7/1990 | Gram |
| 5,057,962 A | 10/1991 | Alley |
| 5,252,915 A | 10/1993 | Sedding |
| 5,264,778 A | 11/1993 | Kimmel |
| 5,363,047 A | 11/1994 | Dresti |
| 5,508,620 A | 4/1996 | Pfiffner |
| 5,514,963 A | 5/1996 | Korbmacher |
| 5,519,300 A | 5/1996 | Leon |
| 5,581,470 A | 12/1996 | Pawloski |
| 5,592,393 A | 1/1997 | Yalla |
| 5,633,550 A | 5/1997 | Meehan |
| 5,675,465 A | 10/1997 | Tanaka |
| 5,739,693 A | 4/1998 | Pfiffner |
| 5,764,462 A | 6/1998 | Tanaka |
| 5,805,395 A | 9/1998 | Hu |
| 5,933,306 A | 8/1999 | Santos |
| 5,982,595 A | 11/1999 | Pozzuoli |
| 6,121,886 A | 9/2000 | Anderson |
| 6,137,187 A | 10/2000 | Mikhail |
| 6,169,489 B1 | 1/2001 | Kliman |
| 6,262,550 B1 | 7/2001 | Kliman |
| 6,294,898 B2 | 9/2001 | Lawson |
| 6,396,284 B1 | 5/2002 | Tisdale |
| 6,426,632 B1 | 7/2002 | Clunn |
| 6,459,269 B1 | 10/2002 | Jones |
| 6,492,801 B1 | 12/2002 | Sims |
| 6,525,504 B1 | 2/2003 | Nygren |
| 6,714,020 B2 | 3/2004 | Hobelsberger |
| 6,794,879 B2 | 9/2004 | Lawson |
| 6,794,883 B2 | 9/2004 | Klingel |
| 6,815,932 B2 | 11/2004 | Wall |
| 6,839,207 B2 | 1/2005 | Falliot |
| 6,924,565 B2 | 8/2005 | Wilkins |
| 6,924,628 B2 | 8/2005 | Thompson |
| 6,975,946 B2 | 12/2005 | Al-Hamrani |
| 6,992,490 B2 | 1/2006 | Nomoto |
| 7,006,935 B2 | 2/2006 | Seki |
| 7,253,634 B1 | 8/2007 | Kasztenny |
| 7,304,403 B2 | 12/2007 | Xu |
| 7,498,818 B2 | 3/2009 | Benmouyal |
| 7,528,611 B2 | 5/2009 | Kasztenny |
| 7,532,010 B2 | 5/2009 | Kamel |
| 7,592,772 B2 | 9/2009 | Nandi |
| 7,710,693 B2 | 5/2010 | Guzman-Casillas |
| 7,804,303 B2 | 9/2010 | Benmouyal |
| 8,405,940 B2 | 3/2013 | Schweitzer, III et al. |
| 9,236,726 B2 * | 1/2016 | Safari-Shad ............ A61B 1/125 |
| 10,088,506 B2 * | 10/2018 | Rodriguez ............. G01R 23/00 |
| 10,288,688 B2 | 5/2019 | Kasztenny |
| 2001/0001534 A1 | 5/2001 | Lawson |
| 2002/0128759 A1 | 9/2002 | Sodoski |
| 2002/0140433 A1 | 10/2002 | Lawson |
| 2005/0033481 A1 | 2/2005 | Budhraja |
| 2006/0125486 A1 | 6/2006 | Premerlani |
| 2007/0085549 A1 | 4/2007 | Fischer |
| 2008/0074810 A1 | 3/2008 | Guzman-Casillas |
| 2009/0160454 A1 | 6/2009 | Johansson |
| 2009/0219030 A1 | 9/2009 | Salem |
| 2009/0254297 A1 | 10/2009 | Bengtsson |
| 2012/0112758 A1 | 5/2012 | Weems |

FOREIGN PATENT DOCUMENTS

| | | | |
|---|---|---|---|
| CN | 105548799 A | * | 5/2016 |
| CN | 108680858 | | 10/2018 |
| CN | 106771835 | | 6/2019 |
| JP | 53-107640 | | 9/1978 |
| JP | 56-002569 | | 1/1981 |
| JP | 03-212117 | | 9/1991 |
| JP | 07-177646 | | 7/1995 |
| JP | 11-133093 | | 5/1999 |
| JP | 2000-333359 | | 11/2000 |
| WO | 02/39642 | | 5/2002 |
| WO | 2014067742 | | 5/2014 |
| WO | 2014173132 | | 10/2014 |
| WO | WO-2014173132 A1 * | 10/2014 | ........... G01R 31/346 |

OTHER PUBLICATIONS

Siemens AG, Numerical Machine Protection Manual 7UM515, V3.1, Published 1996.

Tyco Electronics "Installation and Operating Instructions R.O.C.O. F. Protection Relay" Cromptom Instruments ROCOF Manual, Issue 1, Tyco Electronics UK Limited Crompton Instruments, Nov. 2002.

Gao Jingde, Wang Xiangheng, Zhang Linzheng: "Circuit Analysis of AC Machines—Multi-Loop Model and Parameters" 2009.

Li Yong-Gang, Shi Wei, "Multi-Loop Model and Simulation Research of Hydrogenerators with Rotor Winding Inter-Turn Short Circuit Fault" 2011 International Conference on Electrical Machines and Systems, Aug. 20-23, 2011.

EP Application # 20193240.7, European Search Report, dated Jan. 19, 2021.

Sungsoo Kim, et al "CT Requirements for Generator Split-Phase Protection" Originally presented at the 38th Annual Western Protective Relay Conference, Oct. 2011.

ABB "Type DGF Generator Field Relay" Instruction Leaflet 41-747G, ABB Inc., Feb. 1977.

Beckwith Electric Co. "Generator Protection M-3425A" Published 2001.

J.Lewis Blackburn, Protective Relaying Principles and Applications, Chapter 8: Generator Protection, pp. 262-267, 1997.

* cited by examiner

GENERATOR ROTOR TURN-TO-TURN FAULT DETECTION USING FRACTIONAL HARMONICS

RELATED APPLICATIONS

This application claims benefit under 35 U.S.C. § 119 to U.S. Provisional Patent Application Ser. No. 62/892,731 filed on 28 Aug. 2019 titled "Generator Rotor Turn-to-Turn Fault Detection Using Fractional Harmonics" naming Matchyaraju Alla, Ritwik Chowdhury, Normann Fischer, and Dale S. Finney as inventors, which is incorporated by reference in its entirety.

TECHNICAL FIELD

This disclosure relates to this disclosure relates to the detection of faults on an electric power generator. The detected fault may be a rotor turn-to-turn faults, a rotor double point grounding or the like. More particularly, this disclosure relates to detection of such rotor conditions using fractional harmonics.

BRIEF DESCRIPTION OF THE DRAWINGS

Non-limiting and non-exhaustive embodiments of the disclosure are described, including various embodiments of the disclosure with reference to the figures, in which.

Figure 1:
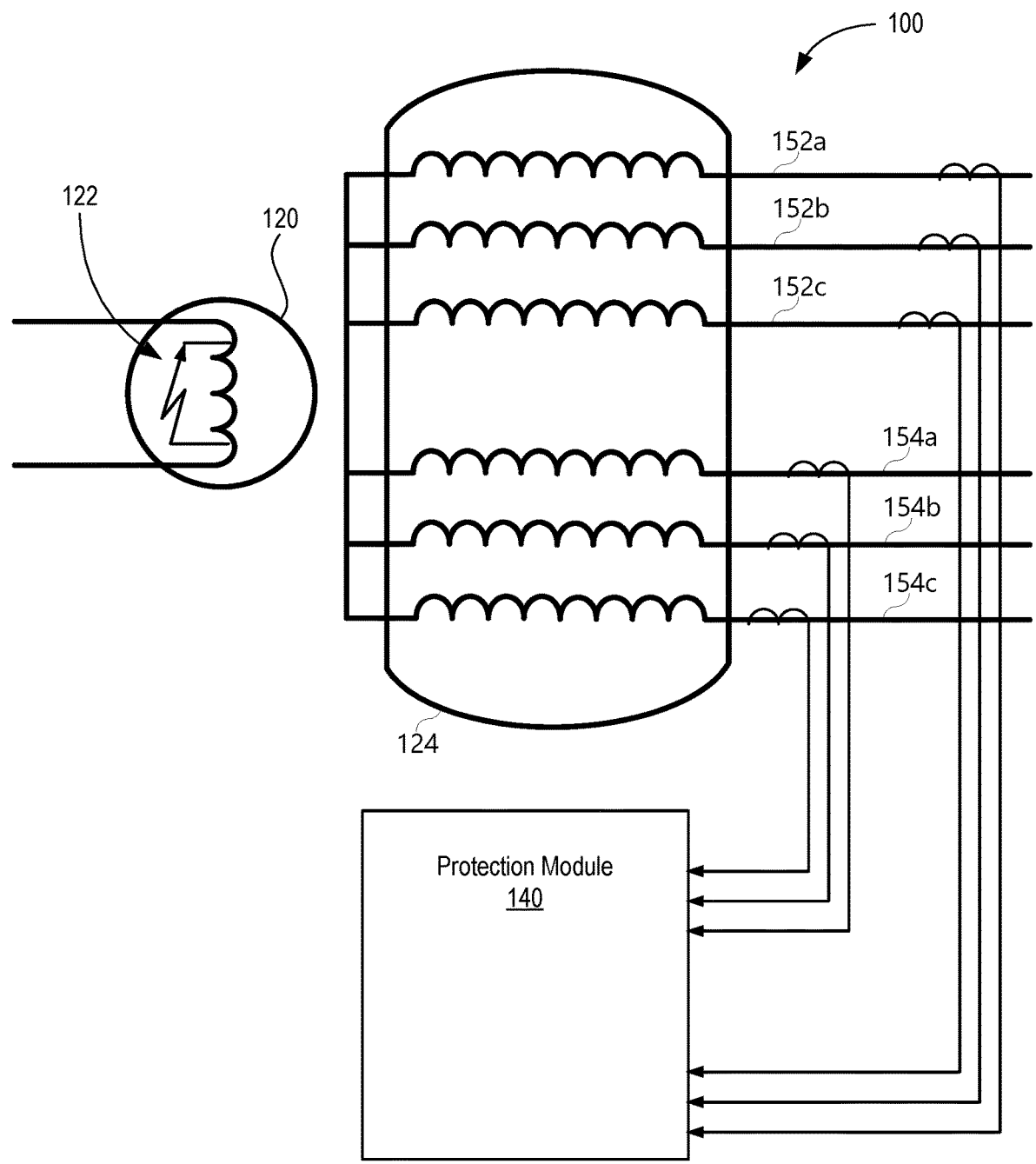
FIG. 1 illustrates a simplified block diagram of a generator with a rotor turn-to-turn fault and a system for detecting the rotor turn-to-turn fault.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power generators are used to generate electric power for transmission and delivery to loads. Electromagnetic generators convert mechanical power to electrical power by driving a rotating magnetic field using a rotor within a stator to induce electrical current within the stator. The rotor and stator may consist of multiple poles, each of which include windings (or coils) through which current flows. Various possibilities for electrical fault conditions exist for electromagnetic generators. Faults may include, for example, shorts between windings on the rotor, shorts to ground from any conductor, shorts between windings on the stator, shorts between rotor and stator windings, and the like. For proper functioning of the electrical generator and to avoid further damage to the generator, it is essential that faults be quickly detected and identified. Upon detection, the generator may be disconnected from the larger electric power system, and upon identification of the fault, further actions may be taken to correct for the condition that resulted in the fault.

A turn fault of an electric power generator may include faults between coils of a single phase of the stator (i.e. stator turn fault or turn-to-turn fault) and/or may include faults between coils of rotor windings (i.e. rotor turn faults) or even between windings and ground. Turn-to-turn or double point ground faults on a rotor of a generator may result in severe damage to the generator and inhibit safe operation of the machine if the fault is not detected and handled quickly. Detecting rotor faults has proved challenging, especially on machines that include multiple branches per phase on the stator.

Continued operation of an electrical generator under faulted conditions may result in further damage to, or even destruction of the generator. Electrical faults may cause an unbalance in the electromagnetic field between the rotor and the stator, which may cause oscillations in the rotation of the rotor. Faults may propagate to damage additional coils and branches of the generator. Accordingly, detection and identification of generator faults is imperative to the operation of the generator.

Detection and identification of rotor faults may be difficult in generator installations, particularly given the signals that are available in typical generator installations. Current measurements from the rotor may not be readily available. Instead, electrical measurements from the stator and/or from grounding transformers may be available. Reliable detection of rotor faults that do not involve windings of the stator has proven to be a challenge. Accordingly, what is needed is an improvement to generator protection, allowing for detection and identification of rotor faults using available electrical signals from the generator.

Stators, especially in large generators, may include several parallel branches for each phase. Under unfaulted conditions, the current in each parallel branch of a single phase should be substantially equal. The generator stator may be constructed such that the branches are grouped and the groups of branches are externally accessible, allowing the currents flowing in two or more groups to be compared using split-phase current transformers (CTs). In various other configurations, separate current measurements from each branch are not accessible. Typical generator protection uses available signals from the generator, such as currents from the stator as described. However, typical generator protection using fundamental or integer harmonic components of such currents is not satisfactory for detecting and identifying a rotor fault such as a rotor turn-to-turn fault or a multi-point ground fault.

What is needed are systems and methods useful for detecting rotor faults including rotor turn-to-turn faults and rotor multi-point ground faults, regardless of the configuration of stator phase branches or the accessibility of measurements from the branches. Presented herein are systems and methods of detecting such rotor faults using fractional harmonics.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and/or a product of a process.

The phrases "connected to," "networked," and "in communication with" refer to any form of interaction between two or more entities, including mechanical, electrical, magnetic, and electromagnetic interaction. Two components may be connected to each other, even though they are not in direct physical contact with each other and even though there may be intermediary devices between the two components. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as: non-volatile memory, static RAM, dynamic RAM, ROM, CD-ROM, disk, tape, magnetic, optical, flash memory, or other computer readable storage medium.

The described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order. In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates a simplified block diagram of a generator 100 that includes a stator 124 and a rotor 120. The stator 124 may include multiple parallel branches that include windings for three phases, A, B, and C. In particular, the stator includes windings on phase A branch 152a, 154a, phase B branch 152b, 154b, and phase C branch 152c, 154c. Currents from each branch may be made available using separate CTs or split-phase CTs or the like to a protection module 140. The protection module 140 may be configured to detect a rotor fault 122 such as a rotor turn-to-turn fault or a rotor multiple-point-to-ground fault using the various embodiments described herein. Although two branches for each phase are shown in the illustrated stator, the stator may include a single branch per phase, or multiple branches per phase. Furthermore, the rotor may include multiple poles.

Figure 2A:
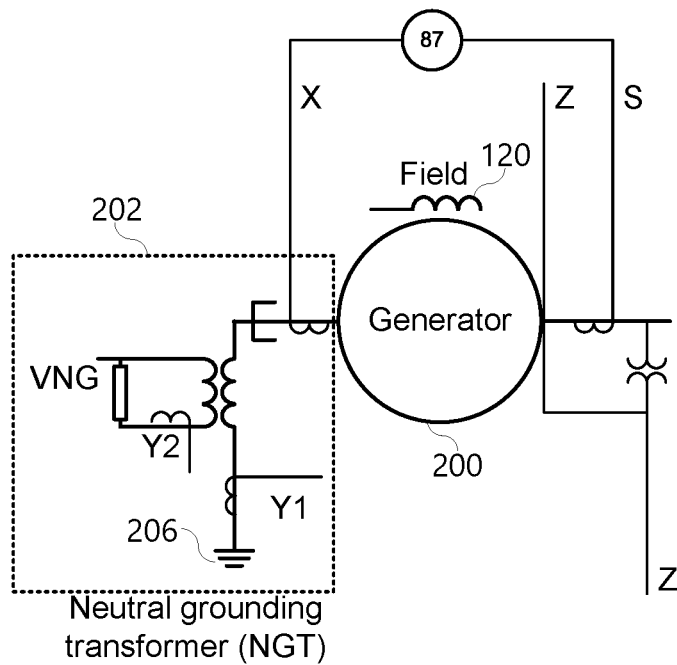
FIG. 2A illustrates a simplified block diagram of a generator and signals obtained to determine a rotor turn-to-turn fault.
Figure 3B:
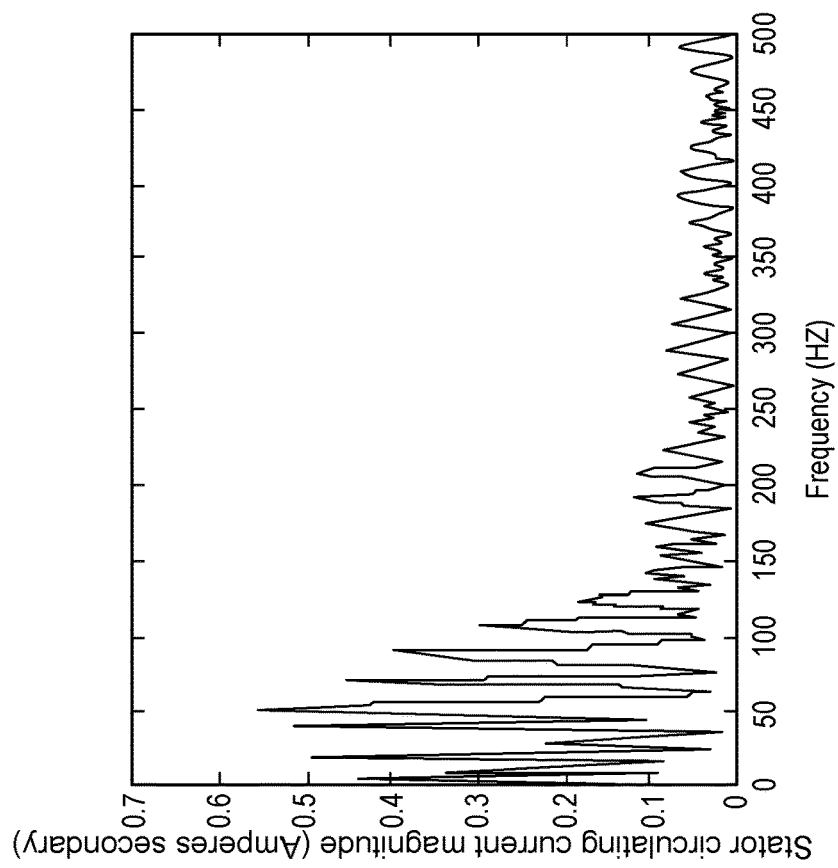
FIGS. 3A and 3B illustrate frequency responses of stator circulating currents for two different rotor turn-to-turn fault conditions.

FIGS. 2A and 3B illustrate simplified block diagrams of generators and signals available from the generators that may be useful for detecting rotor fault conditions in accordance with several embodiments described herein. In particular, FIG. 2A similarly illustrates a generator 200 and various electrical signals that may be obtained from the generator and used to detect rotor faults in accordance with embodiments herein. Current signals S from the stator terminals as well as current signals X from the neutral side of the stator may be obtained and used for differential protection. Terminal voltage signals Z may be available for various generator protection elements. A neutral grounding transformer (NGT) 202 may be used to provide a connection from the neutral terminal of the stator to ground 206. Current signal Y1 from the transformer 202 to ground 206 may be available. Similarly, a current signal Y2 related to the current through a neutral grounding transformer (NGT) primary or secondary may be made available.

Figure 2B:
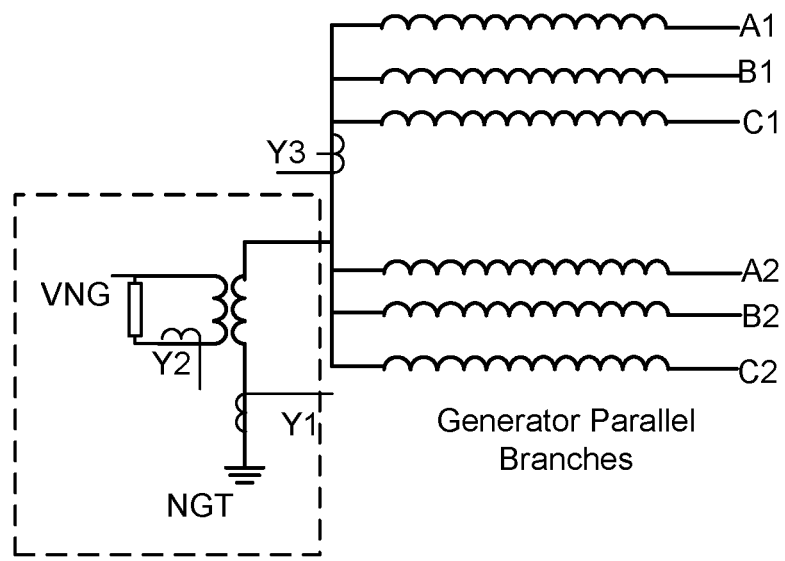
FIG. 2B illustrates a simplified block diagram of a generator and signals obtained to determine a rotor turn-to-turn fault.

FIG. 2B illustrates yet another configuration of signals useful for detecting rotor faults in accordance with several embodiments herein. Current signal Y3 (which may be obtained using, for example, an inter-neutral CT as illustrated) is representative of a current through the neutral of a stator branch for a multi branch generator stator that may be used to detect a rotor fault condition in accordance with several embodiments described herein.

Figure 3A:
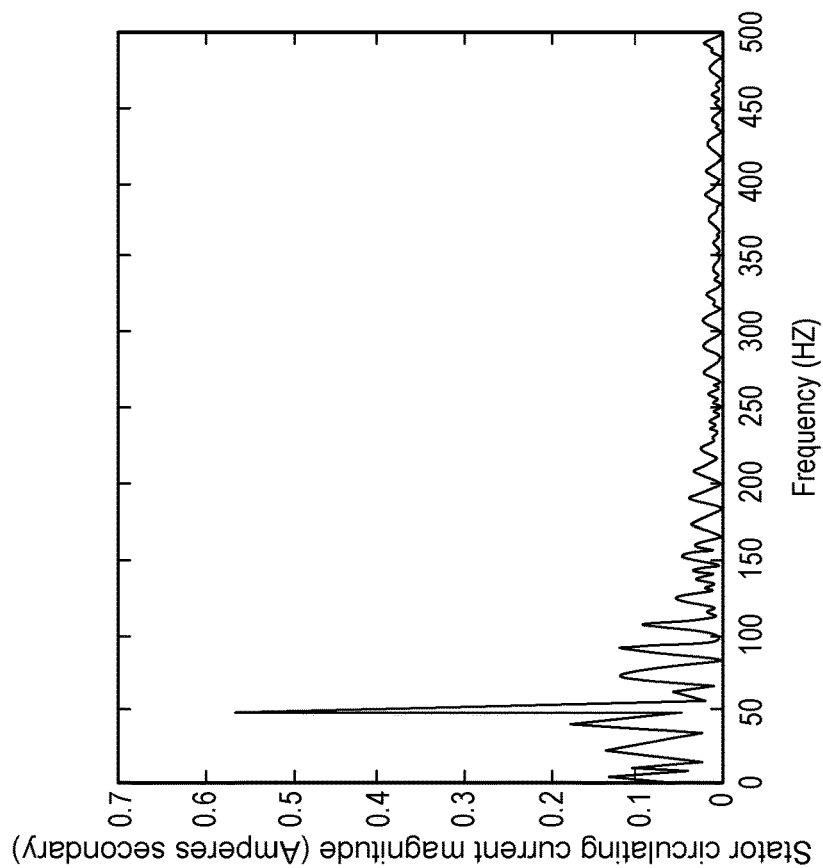

FIGS. 3A and 3B illustrate plots of the frequency response of different turn-to-turn fault conditions of a rotor. In particular, FIG. 3A illustrates the circulating current magnitude in one of the stator branches over a range of frequencies for a rotor turn-to-turn fault that involves 3% of the rotor pole winding FIG. 3B illustrates the circulating current magnitude in one of the stator branches over a range of frequencies for a rotor turn-to-turn fault that involves 10% of the rotor pole winding It should be noted that the circulating current magnitude in one of the stator branches at the fundamental frequency of the power system (50 Hz) is the highest peak value in each figure, with multiple peaks at harmonics and fractional harmonics of the fundamental frequency. The embodiments described herein use the frequency response of the circulating current magnitude in one of the stator branches and/or a zero-sequence voltage, V0, to determine a rotor fault condition.

It should be noted that zero-sequence voltage V0 may be measured at different locations in the electric power generator installation, and any of these V0 signals may be used to detect the rotor fault condition. Terminal zero-sequence voltage V0 signals may be obtained from the generator terminal. Neutral-to-ground voltage (VNG) is a zero-sequence voltage measured at the generator neutral. In various figures herein the VNG signal is illustrated. However, it is understood that the terminal zero-sequence voltage signal may be used just as the VNG signal is used to detect the rotor fault condition. That is, zero-sequence voltage V0 described herein may be the terminal zero-sequence voltage or the VNG signal. The fundamental voltage magnitude V0M may be determined using the V0 signal (from either the terminal zero-sequence voltage signal or the VNG signal).

Figure 4:
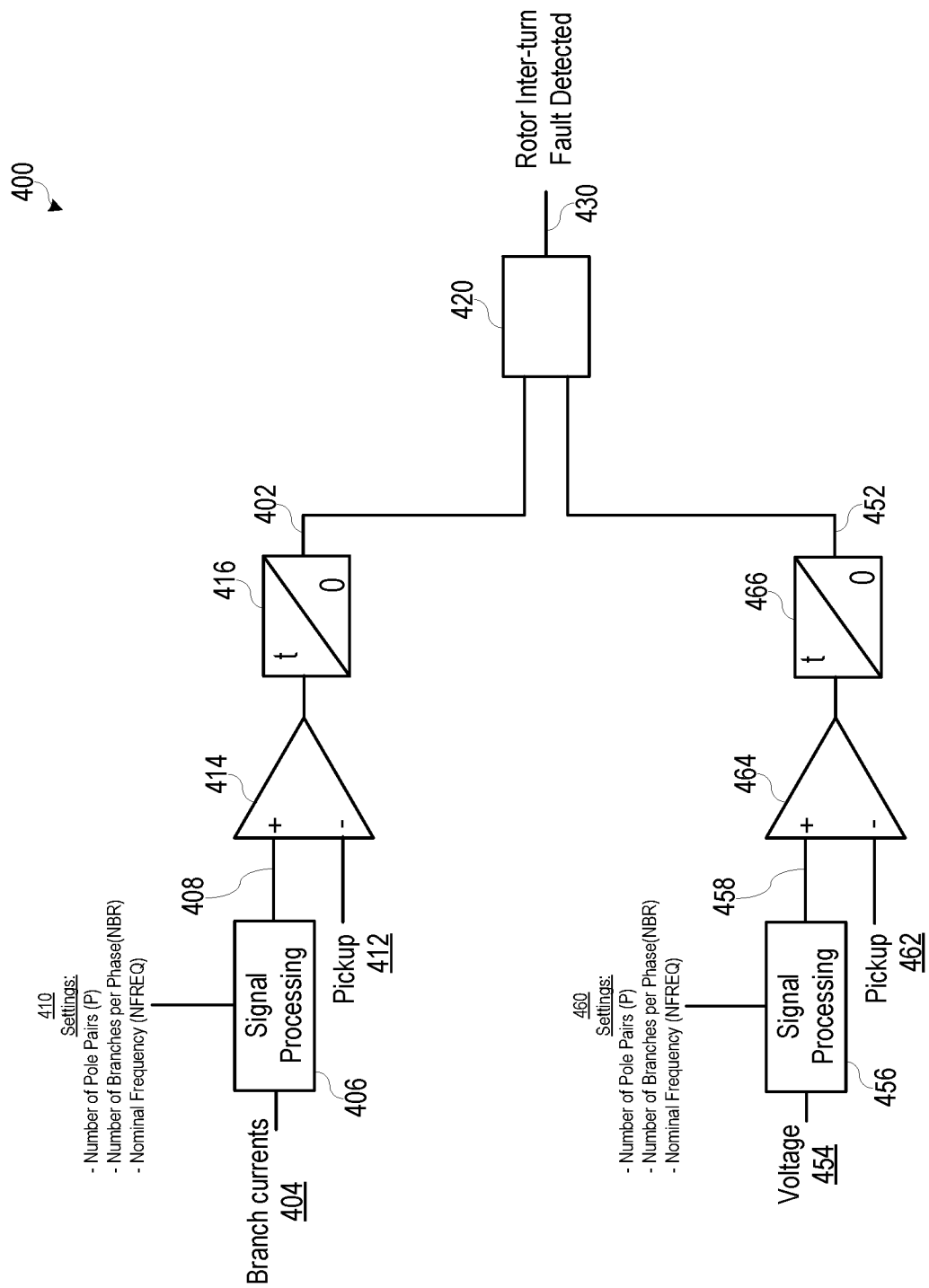
FIG. 4 illustrates a simplified logic diagram for determining a rotor fault using branch currents and/or zero-sequence voltage.

FIG. 4 illustrates a simplified logic diagram of a method 400 to determine a rotor fault using signals described herein. The branch currents 404 and/or using zero-sequence voltage 454. In a first signal processing module 406, the branch currents 404 and certain settings 410 are used to produce a circulating current magnitude 408 at a selected frequency. The settings 410 include the number of pole pairs of the rotor (P), the number of branches per phase in the stator (NBR), and the generator nominal frequency (NFREQ). The circulating current magnitude $I_{CC}$ 408 is compared 414 with a predetermined pickup threshold 412. When the $I_{CC}$ 408 exceeds the pickup threshold 412 for a predetermined time, then timer 416 asserts a first rotor fault signal 402.

Similarly, for use of a zero-sequence voltage 454, a second signal processing module 456 uses settings 460 to produce a neutral-to-ground voltage fundamental magnitude 458. Note that the zero-sequence voltage signal 454 may be obtained using any of a number of signals such as, for example the terminal zero-sequence voltage signal, the neutral-to-ground voltage (VNG) signal, or the like. The settings 460 include the same settings 410 as listed above. The neutral voltage fundamental magnitude 458 is compared 464 with a predetermined pickup threshold 462. When the neutral voltage fundamental magnitude 458 exceeds the pickup threshold 462 for a predetermined time, then timer 466 asserts a second rotor fault signal 452.

The first and second rotor fault signals 402, 452 are made available to logic element 420 for assertion of the rotor turn-to-turn fault detected signal 430. In various embodiments, the logic element 420 may include an AND gate requiring that both rotor fault signals (using branch currents 404 and using zero-sequence voltage 454 ) are asserted in order for a rotor turn-to-turn fault detected signal 430 to be asserted. In other embodiments, the logic element 420 may include an OR gate asserting the rotor turn-to-turn fault detected signal 430 when either of the rotor fault signals (using branch currents 404 and using zero-sequence voltage 454 ) are asserted. In various other embodiments, the logic element 420 may use the first and second rotor fault signals 402, 452 in other combinations to determine the rotor turn-to-turn fault detection signal 430. In various embodiments, only the branch currents 404 may be used; while in other embodiments, only the zero-sequence voltages 454 may be used to determine a rotor turn-to-turn fault condition. Use of the different signal processing and logical branches may depend on which signals are available from the generator. For example, when branch currents are not available, then the zero-sequence voltages may be used; but when branch currents are available, then both the branch currents and zero-sequence voltages may be used. Alternatively, in various embodiments, (in particular when branch currents are not available), then the zero-sequence voltages may be used. In accordance with various embodiments, when branch currents are available, then the zero-sequence voltages will not be used and the branch currents will be used.

It should be noted that the zero-sequence voltage signal 454 may be obtained or calculated using one or more of several available signals from the generator. Returning to FIGS. 2A and 2B, the zero-sequence voltage signal 454 may be provided using the current signal Y1 representing a current to ground from the neutral grounding transformer. The current signal from Y1 may require appropriate scaling. The zero-sequence voltage signal 454 may be provided as Y2 representing a current in a neutral grounding voltage transformer of the neutral grounding transformer. The zero-sequence voltage signal 454 may be provided as Y3 representing a neutral signal on the stator.

Turning to the signal processing blocks 406 circulating current magnitude $I_{CC}$ at the first fractional harmonic 1/P for one phase may be calculated using a finite impulse response (FIR) filter with cosine coefficients (sometimes referred to as a cosine filter) in accordance with Equations 1-5:

$$I_{CC} = \frac{2}{N}\sum_{n=0}^{N-1} I_n * b_n \qquad \text{Eq. 1}$$

$$I_n = \sum_{pb=1}^{NBR} -1^{(pb+1)} I_{pb} \qquad \text{Eq. 2}$$

$$b_n = \frac{\sqrt{2}}{H*SPC} * \cos\left(2\pi * \frac{1}{H} * \frac{g}{SPC}\right) \qquad \text{Eq. 3}$$

$$g = \{1, 2, \ldots, H*SPC\} - 0.5 \qquad \text{Eq. 4}$$

$$H = K*\left(\frac{P}{NBR}\right) \qquad \text{Eq. 5}$$

where:
$I_{CC}$ represents the circulating current magnitude at the first fractional harmonic 1/P for one phase;
N represents the length of the filter window;
$I_n$ represents the phase circulating current for sample n;
pb represents the parallel branch number in the selected phase;
NBR represents the number of branches per phase of the stator;
$b_n$ represents the numerator coefficients of the filter used to calculate the circulating current magnitude $I_{CC}$;
H represents the fractional harmonic order;
SPC represents the number of samples per cycle at the fundamental frequency;
P represents the number of pole pairs of the rotor; and,
K is a coefficient dependent on the input signal used.

The coefficient K is selected as 2 when circulating currents are used, and 1 when a voltage signal is used. This is to account for the polarity inversion when the pole magnetomotive force (MMF) transitions from one branch to another.

Equations 1-5 are illustrated for determining the circulating current magnitude $I_{CC}$ for a single phase of a multiple-phase generator. For example, in a generator with 4 branches per phase, and branch currents used, the A-phase circulating current $I_{A\_n}$ is the sum: $I_{b1}-I_{b2}+I_{b3}-I_{b4}$, where b1 indicates A-phase branch 1; b2 indicates A-phase branch 2; b3 indicates A-phase branch 3; and b4 indicates A-phase branch 4.

Figure 5:
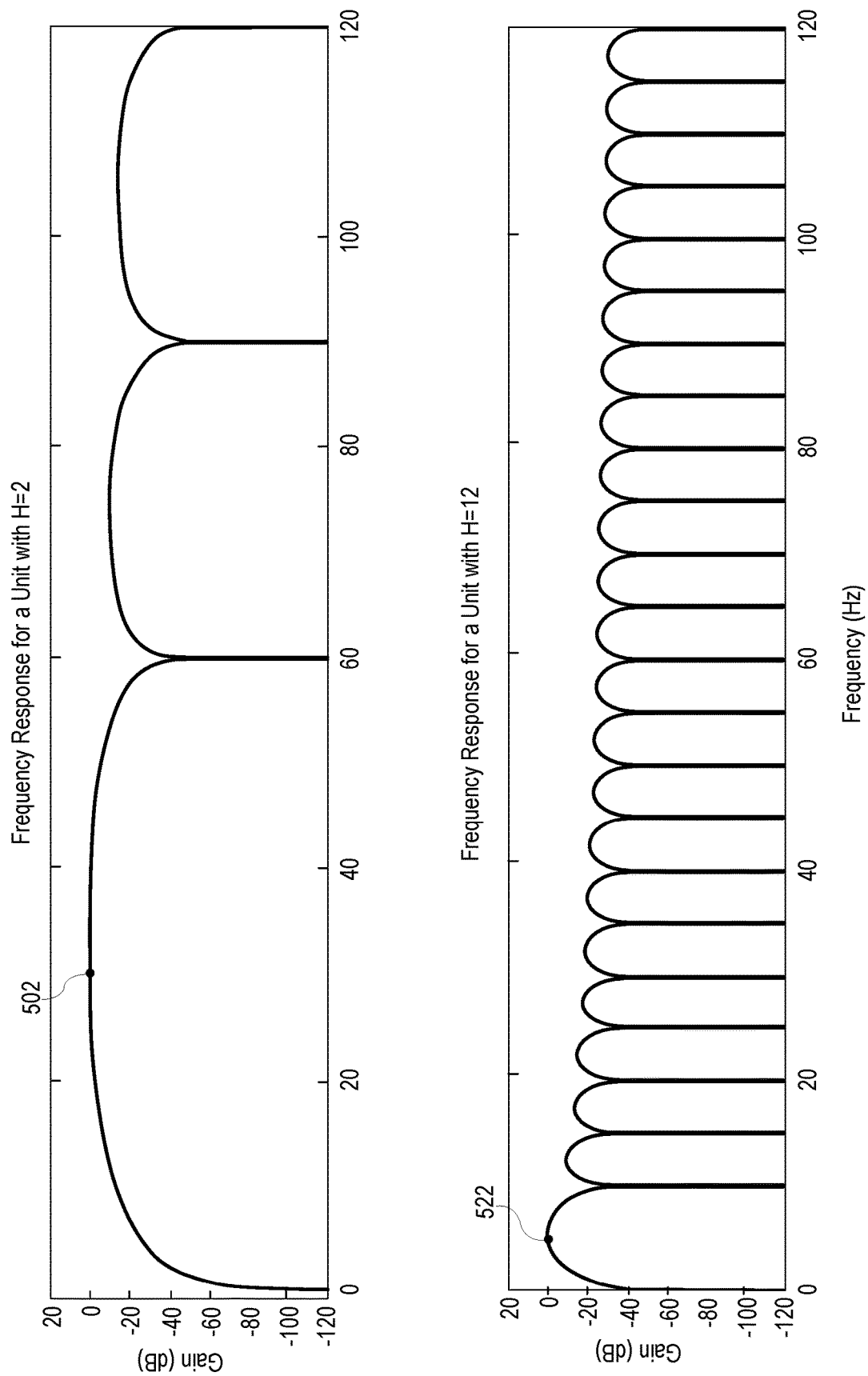
FIG. 5 illustrates a plot of a magnitude of circulating current over a range of frequencies.

The filter (Equation 1) using the coefficients (Equation 3) as above filters the fractional harmonics. FIG. 5 illustrates the filter gain for H=12 (e.g. P=24, NBR=4, K=2) and H=2 (e.g. P=2, NBR=1, K=1). For the purposes of several embodiments herein, the gain at the first fractional harmonic 502, 522 is used in accordance with several embodiments herein to calculate the filtered current and voltage as an output of the signal processing 406, 456 to determine the presence of a rotor turn-to-turn fault. It should be noted that similar filters at the higher fractional harmonic orders (2/P, 3/P, etc.) may be used. It should also be noted that the design of the filter used should be biased toward sensitivity, but does not require design for speed. In various embodiments, the speed of the filter is not as important as the accuracy. Further, it should be noted that other signal processing techniques that achieve similar frequency responses are also contemplated. Although a cosine filter is illustrated, other filters that provide a frequency response as illustrated in FIG. 5 may be used such as, for example, sine filters, CAL filters, Fourier filters, and the like.

Figure 6:
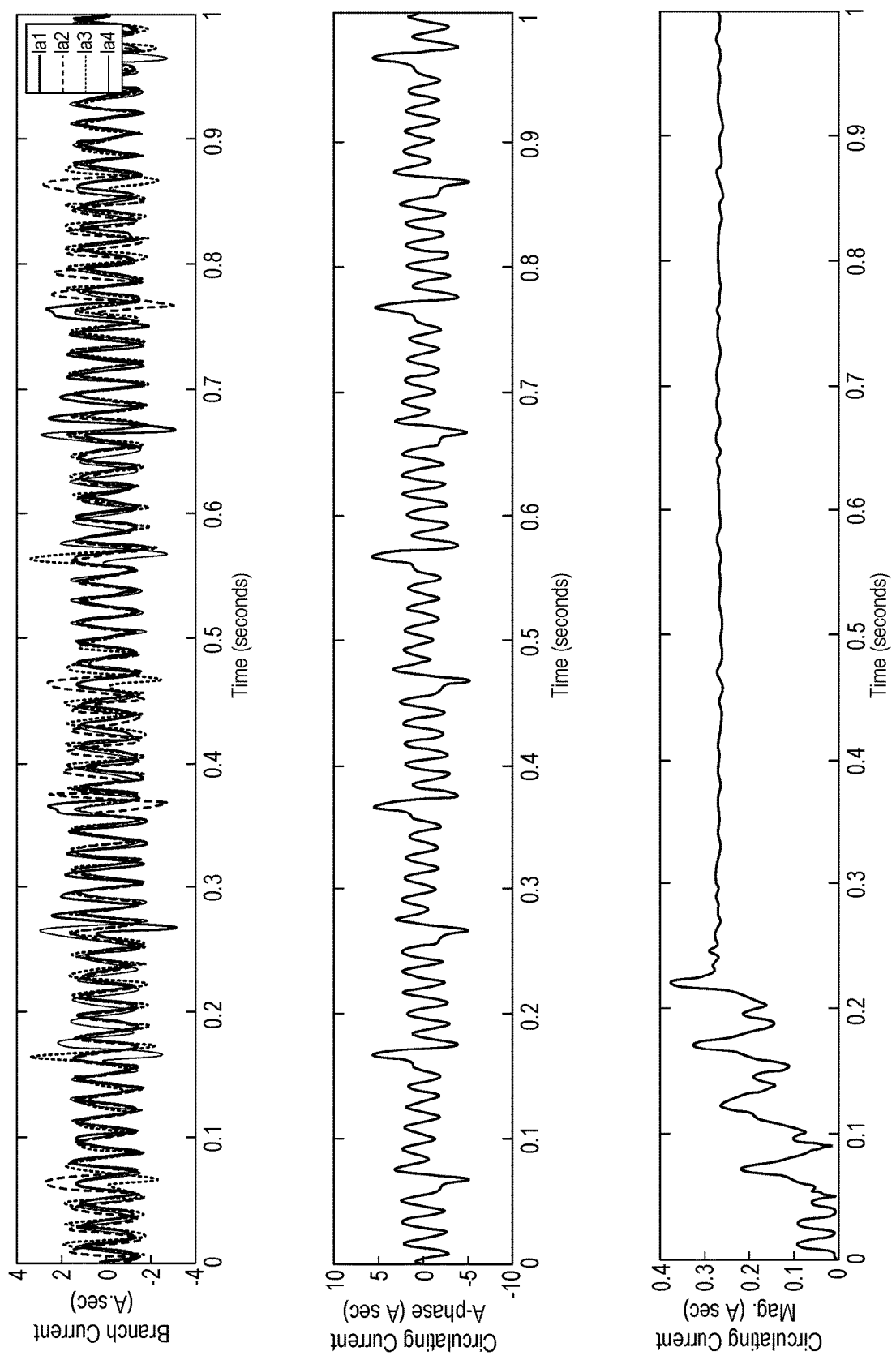
FIG. 6 illustrates plots of branch currents, circulating current and a magnitude of the circulating current at a selected frequency during a rotor turn-to-turn fault.

FIG. 6 illustrates plots of branch currents for each branch of the A-phase, The circulating branch current in the A-phase, and the magnitude of the circulating branch current in the A-phase during a rotor turn-to-turn fault in accordance with several embodiments herein. The faulted generator was a hydro unit with a nominal frequency of 60 Hz, a rotor with 24 pole pairs, and a stator with 4 branches per phase. When branch currents are used, H=12 in accordance with Equation 5. The A-phase circulating current calculated in accordance with Equation 2 is plotted, where an anomaly repeating every 200 ms is apparent, corresponding with the circulating current in the first fractional harmonic of $1/12$. Once filtered, the magnitude of the circulating current $I_{CC}$ 408 settles to around 0.26 A.

Figure 7:
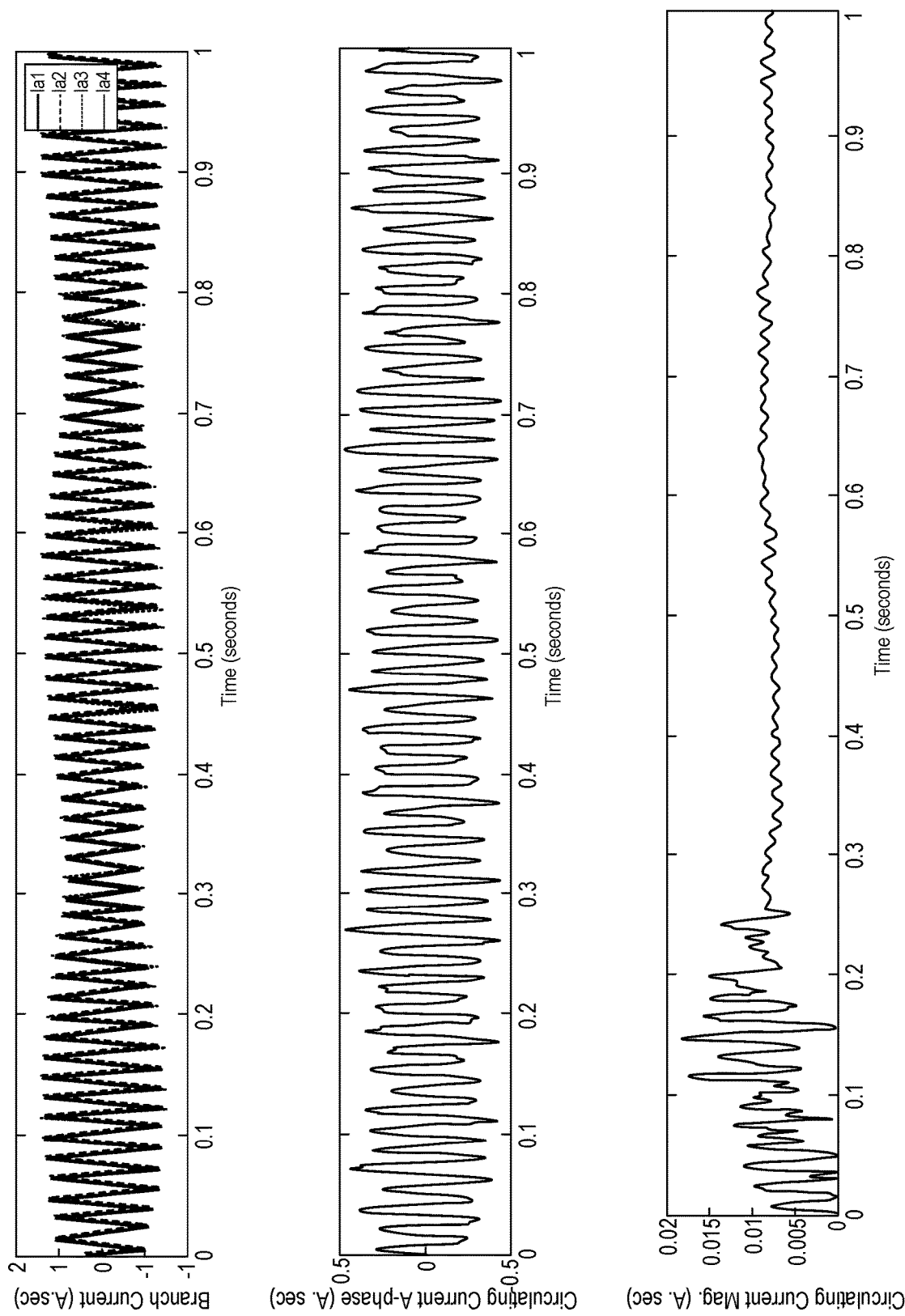
FIG. 7 illustrates plots of branch currents, circulating current and a magnitude of the circulating current at a selected frequency during nominal operating conditions.

Typically, the fractional harmonics in the current circulating between branches for an unfaulted rotor should be very low. Accordingly, the pickup thresholds 412 and 462 may be set relatively low, to increase sensitivity of the rotor turn-to-turn fault detection logic. One example of plots of the branch currents for each branch of the A-phase, A-phase circulating current, and the A-phase magnitude of the circulating current for an un-faulted generator (the generator used for the example plotted in FIG. 6 are illustrated in FIG. 7. The repeating anomaly in the circulating current is absent. The magnitude of the circulating current settles to an average value of less than 10 mA. Accordingly, for this generator, the pickup threshold 412 may be set to around 50 mA to account for possible CT and relay errors.

Figure 8:
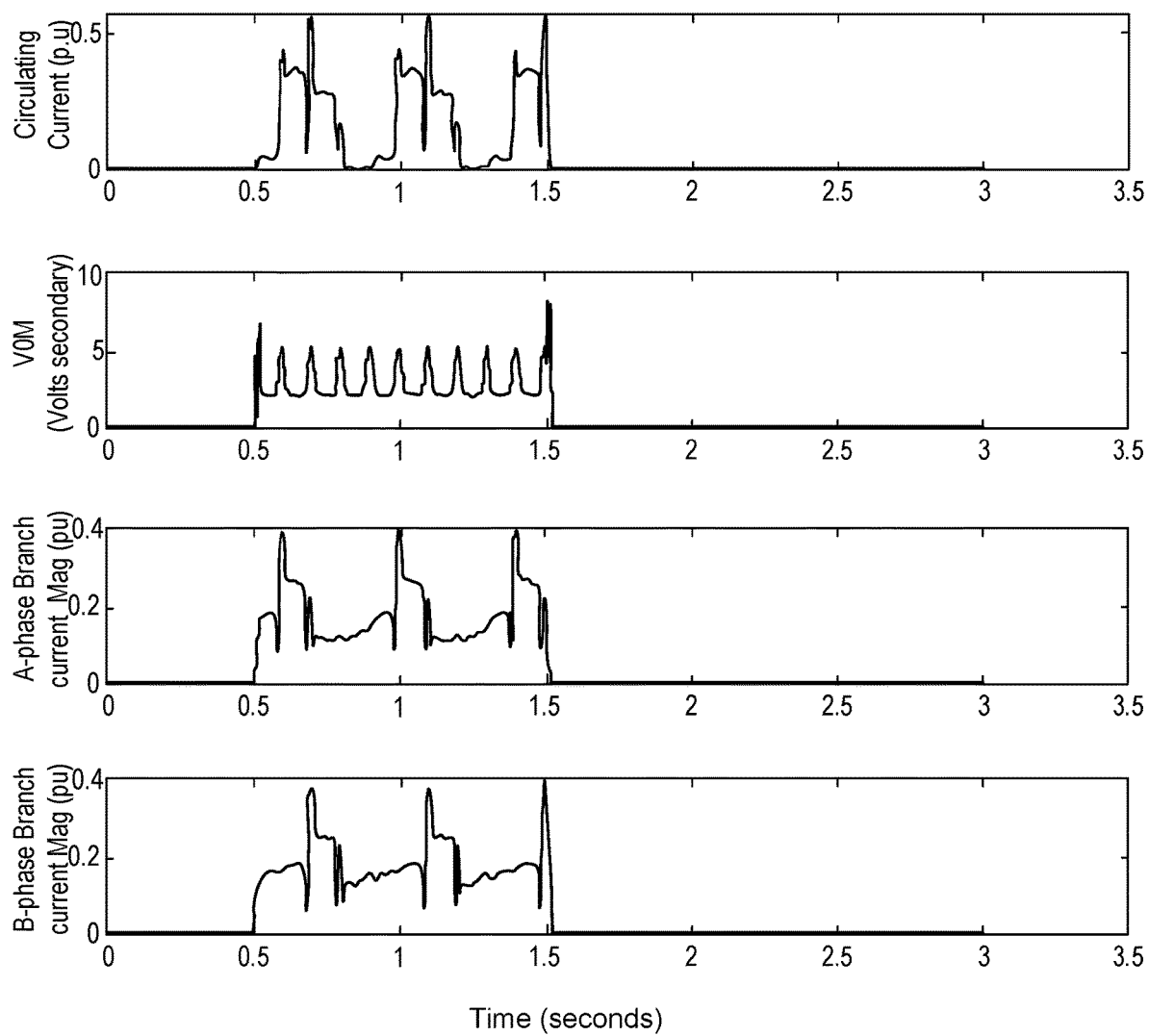
FIG. 8 illustrates plots of circulating current, zero-sequence fundamental voltage magnitude, branch A currents and branch B currents during a rotor fault.

FIG. 8 illustrates plots of the circulating current during a 1-second fault (times 0.5 through 1.5) in per-unit; the zero-sequence voltage magnitude in volts secondary; the branch A current magnitude in per-unit, and the branch B current magnitude in per-unit during a generator rotor turn-to-turn fault. As can be seen, a split-phase overcurrent element may pick up for rotor turn-to-turn faults. Typically, a split-phase overcurrent element has a pickup setting above the fundamental magnitude of the quiescent current and is time-delayed to prevent misoperation during faults and other transients in the power system. For that reason, the split-phase elements can pick up for rotor turn-to-turn faults but may not time out.

Figure 9:
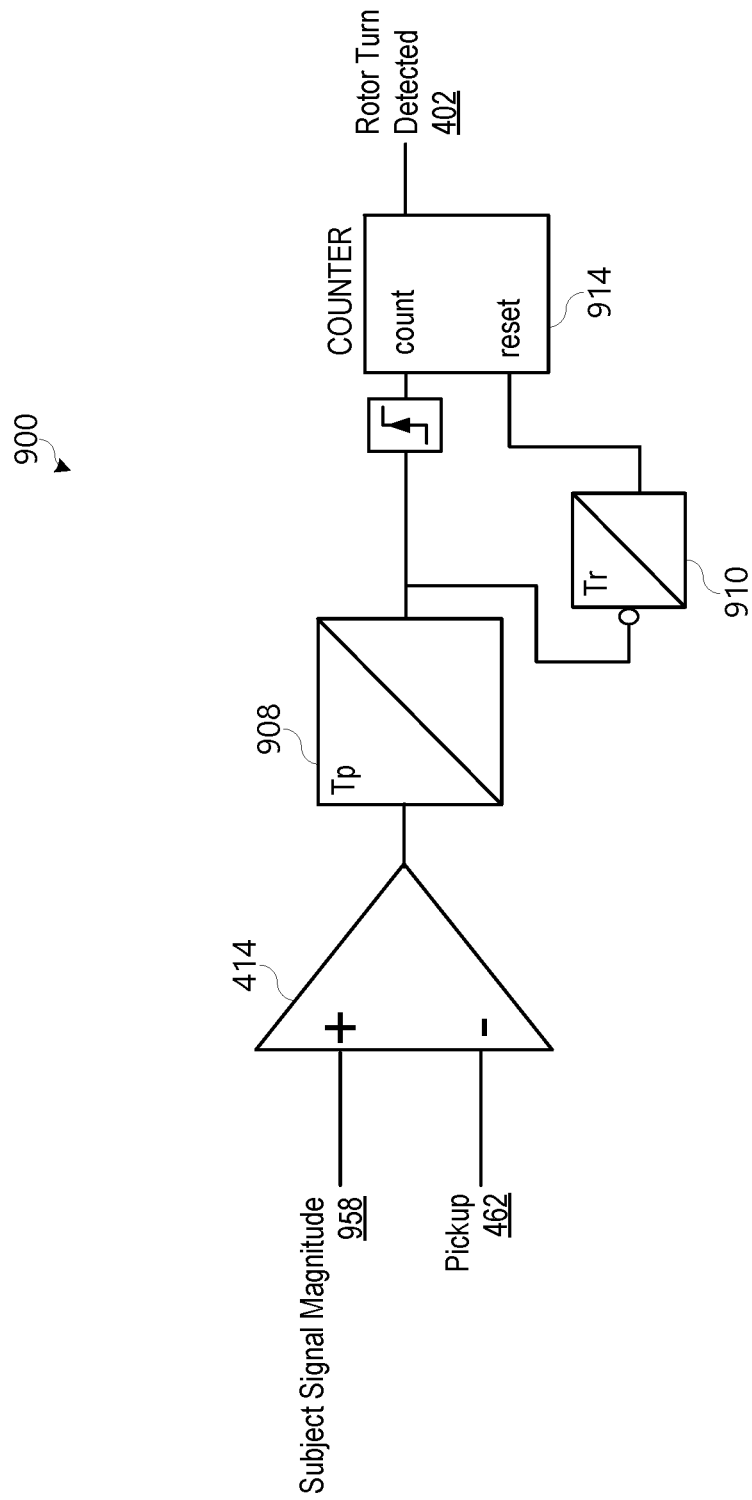
FIG. 9 illustrates a simplified logic diagram of a method for determining a rotor turn-to-turn fault condition.

FIG. 9 illustrates a simplified logic diagram for determining a rotor turn-to-turn fault using counters and the subject signal magnitude 958. The subject signal magnitude 958 may be the circulating current magnitude 408 or the neutral voltage fundamental magnitude 458 described above. When the subject signal magnitude 958 comprises the circulating current magnitude 458, the embodiment illustrated is particularly well suited for the split-phase circulating overcurrent elements. Timer 908 includes the time Tp which may be equal to the processing interval of the protective device (for security pickup). Further, timer 910 may include a reset time Tr of 60 seconds/(rotor speed). A margin may be added to the time Tr. Further a counter 914 is used. In various embodiments, the counter will be 1. Typically, for stator turn faults, the count will be 1. The various settings for the timers and counters may be modified based on the particular signal used in the subject signal magnitude 958.

As indicated above, the neutral voltage, or other signals, could be used in place of branch currents. When such is used, K of Equation 5 should be 1 (for the calculation of H, which is used to calculate $b_n$ in Equation 3). This implies that, for the generator of the examples above, the anomaly should be evident exhibiting a periodicity of around 100 ms (that is, 60 seconds/(number of branches*rotor speed)) as opposed to the periodicity of 200 ms observed using circulating currents. In particular, when a neutral voltage is used in place of currents, the subject signal magnitude 958 will be the voltage fundamental magnitude 458. Equation 6 may be used to calculate the voltage fundamental magnitude $V_F$:

$$V_F = \frac{2}{N}\sum_{n=0}^{N-1} V_n * b_n \qquad \text{Eq. 6}$$

where:
$V_F$ represents the voltage fundamental magnitude at the first fractional harmonic 1/P;
N represents the length of the filter window;
$V_n$ represents the neutral voltage for sample n; and
$b_n$ represents the numerator coefficients of the filter calculated using Equation 3.

Figure 10:
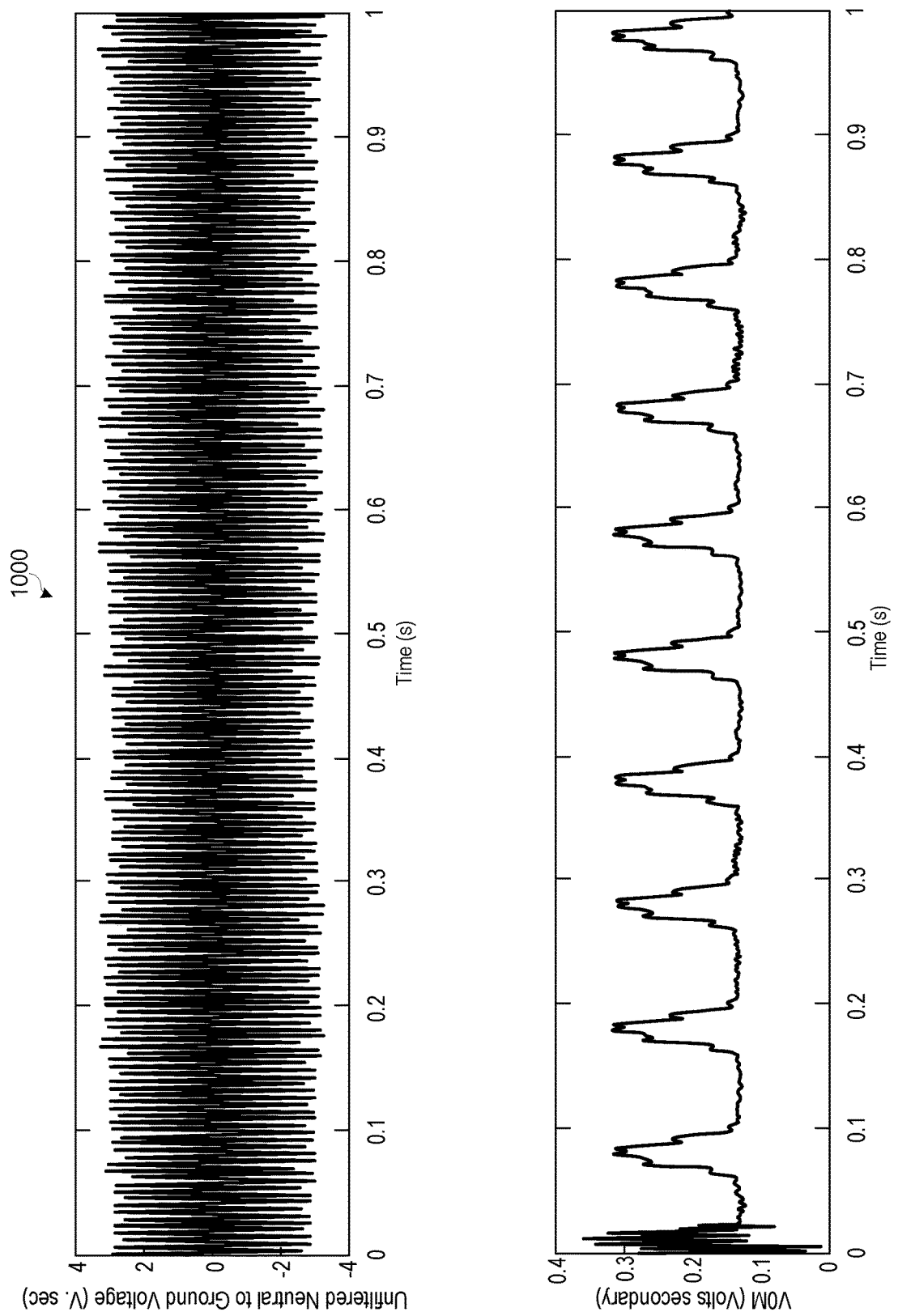
FIG. 10 illustrates plots of raw neutral-to-ground voltage and neutral-to-ground fundamental magnitude of voltage during a rotor fault condition.
Figure 11:
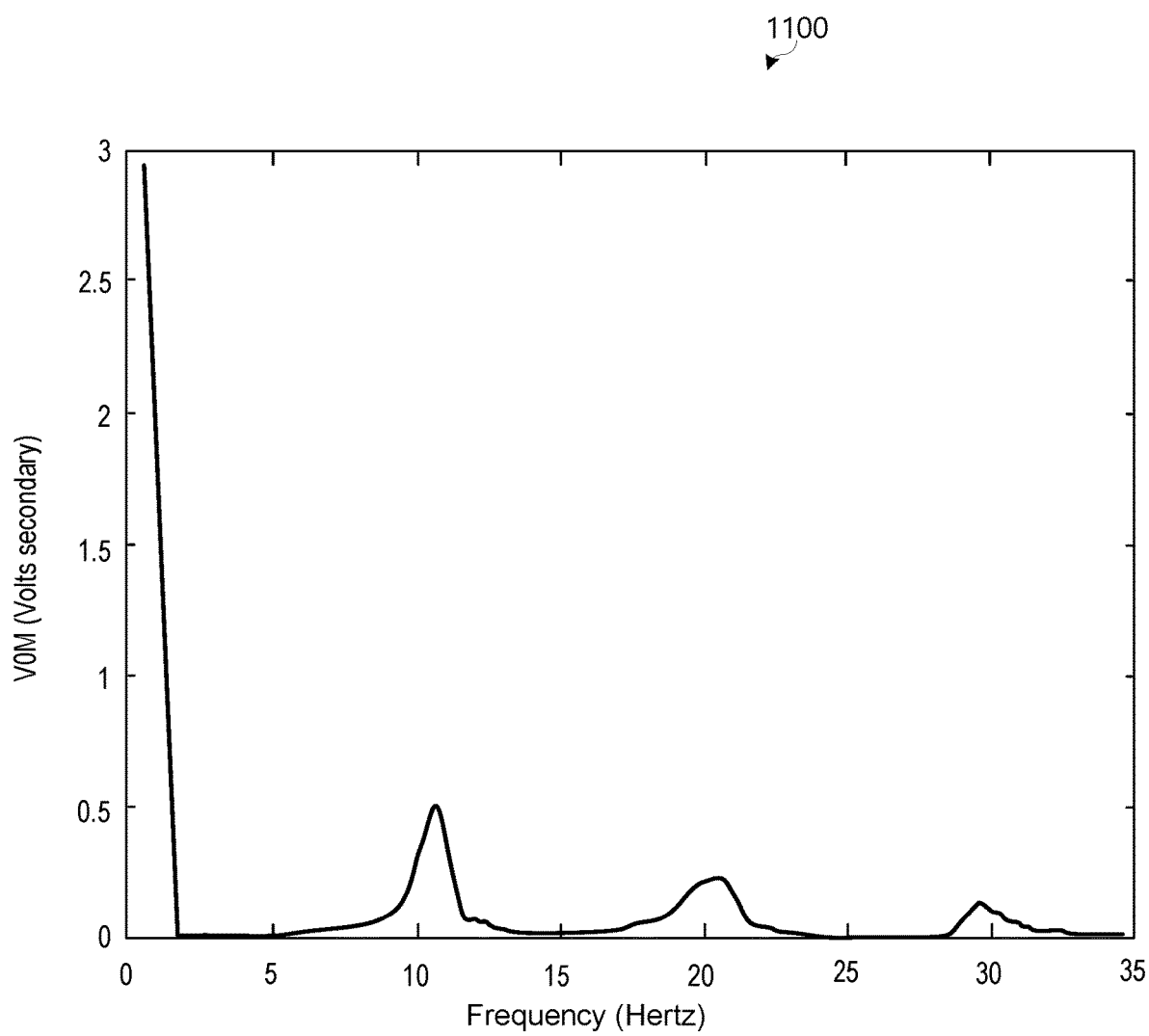
FIG. 11 illustrates a plot of fast-Fourier transform fundamental zero-sequence voltage magnitude.

FIG. 10 illustrates plots 1000 of the unfiltered neutral voltage signal and the fundamental neutral voltage magnitude 458. The Fast Fourier Transform (FFT) of the fundamental zero-sequence voltage magnitude shows a subharmonics approximately every 0.1 second or approximately every 10 Hz. This can be used to identify rotor turn-to-turn faults. Similarly, FIG. 11 illustrates V0M, which is a frequency spectrum transform of zero-sequence voltage magnitude. In certain embodiments, V0M may be formed using the VNG signal (Y2 & Y1 of FIGS. 2A and 2B). The first fractional harmonic is illustrated by the peaks at approximately 10 Hz. It should be noted that Equation 6 may be used to calculate a cosine filtered signal or an FFT signal depending on the function used for $b_n$. Either of these filters may be used in several embodiments described herein.

As suggested above, zero-sequence voltage measured at the stator terminals or at the neutral terminal can be used. The zero-sequence voltage can be measured at the stator terminals using a dedicated broken PT or can be calculated from the Y-connected PT measurements at the stator terminals.

It should also be noted that multiple point rotor-to-ground faults are similarly detected using the embodiments herein. That is, a multiple point rotor-to-ground fault will produce the $I_{CC}$ 408 and neutral voltage fundamental magnitude 458 sufficient to produce the rotor turn-to-turn fault detected signal 430.

Furthermore, it should be noted that failures in a permanent-magnet rotor are also detected using the embodiments herein. That is, a failure in a permanent magnet rotor will produce the $I_{CC}$ 408 and neutral voltage fundamental magnitude 458 sufficient to produce the rotor turn-to-turn fault detected signal 430.

Figure 12:
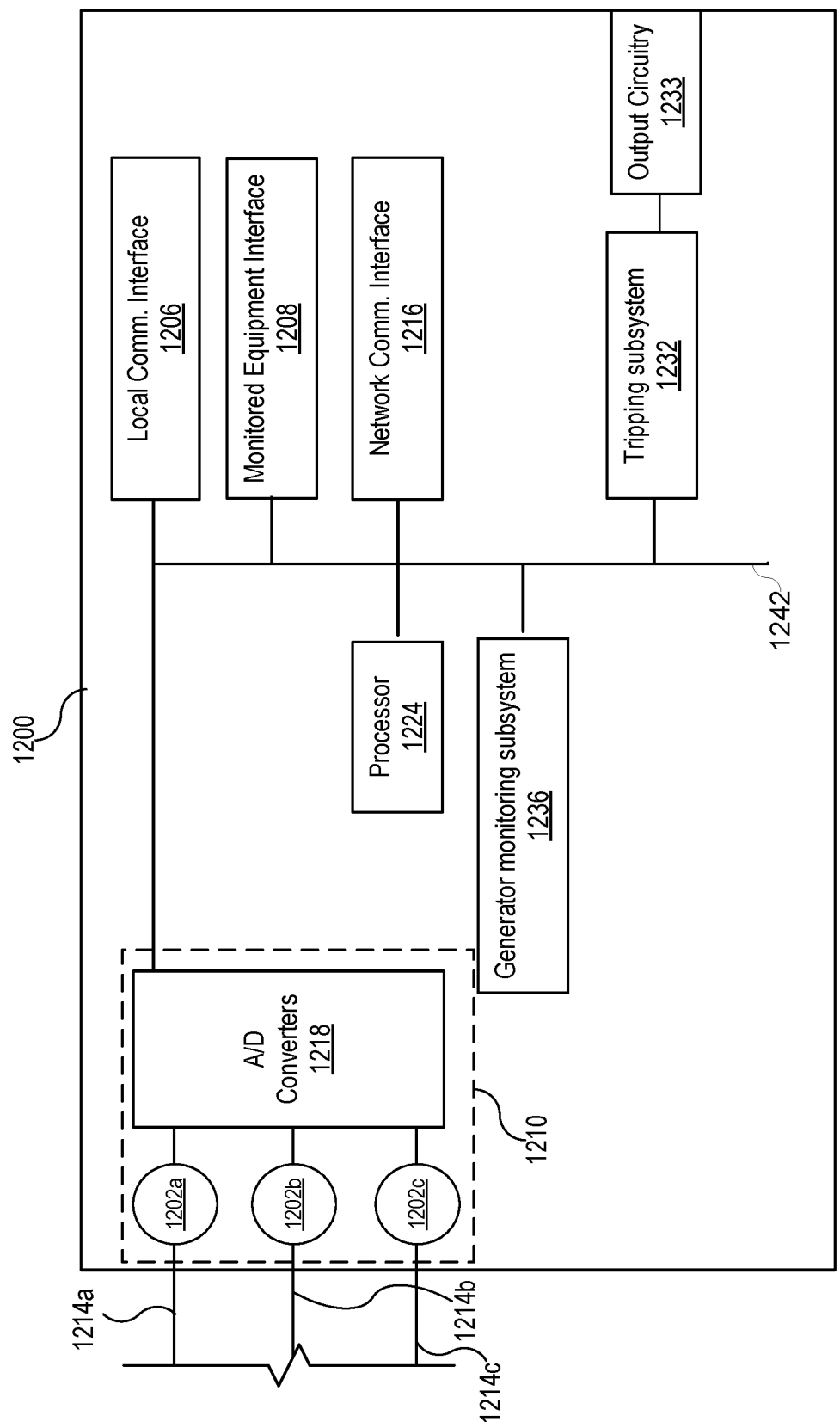
FIG. 12 illustrates a representative simplified diagram of an intelligent electronic device (IED) for determining a rotor fault condition.

FIG. 12 illustrates a simplified block diagram of an IED 1200 that may be used to determine rotor turn-to-turn faults in accordance with the several embodiments described herein. IED 1200 may be configured to perform a variety of tasks using a configurable combination of hardware, software, firmware, and/or any combination thereof. The illustrated embodiment includes hardware and software, and may be implemented in an embedded system, field programmable gate array implementations, and specifically designed integrated circuit. In some embodiments, functions described in connection with various software modules may be implemented in various types of hardware. Moreover, certain components or functions described herein may be associated with other devices or performed by other devices. The specifically illustrated configuration is merely representative of one embodiment consistent with the present disclosure.

IED 1200 includes a network communications interface 1216 configured to communicate with other IEDs and/or system devices. In certain embodiments, the network communications interface 1216 may facilitate direct communication with another IED or communicate with another IED over a communications network. The network communications interface 1216 may facilitate communications with multiple IEDs. The communications interface 1216 may be used to monitor and determine if the communication channel is healthy and/or to determine an order of circuit breakers to trip. Note that any suitable communication network and/or communication channel may be used to communicate voltage data, quality of the communicated information, the biasing factors, or any other suitable data that may be communicated between the generators. Further, any suitable communication protocol to communicate the data may be used, such as Ethernet, Synchrophasor, DB9, peer-to-peer, or a proprietary protocol, among others.

IED 1200 may further include a monitored equipment interface 1208 to receive status information from, and issue control instructions to, a piece of monitored equipment. In some embodiments, the monitored equipment may be a generator, a circuit breaker, or the like, and IED 1200 may be configured to control the operation of the generator and/or circuit breaker.

A local communication interface 1206 may also be provided for local communication. The local communication interface 1206 may be embodied in a variety of ways, including as a serial port, a parallel port, a Universal Serial Bus (USB) port, an IEEE 1394 Port, and the like.

In certain embodiments, IED 1200 may include a sensor component 1210 (e.g., sensor circuitry) to obtain electrical signals related to the generator. The sensor component 1210 may be configured to obtain branch current signals, zero-sequence voltage signals, neutral voltage signals, neutral current signals, or other such signals useful for determining a rotor turn-to-turn fault condition of the generator. In the illustrated embodiment, sensor component 1210 is configured to gather data directly from instrument transformers and may use, for example, A/D converters 1218 that may sample and/or digitize filtered waveforms to form corresponding digitized current and voltage signals provided to data bus 1242. Inputs 1214*a-c* may be electrically connected to an output of a generator, such as to the terminals of the electric power generator (via instrument transformers or the like). In various embodiments transformers (1202*a*, 1202*b*, 1202*c*) may reduce the voltage or current to a level appropriate for monitoring the generator. A/D converters 1218 may include a single A/D converter or separate A/D converters for each incoming signal. A current signal may include separate current signals from each phase of a three-phase electric power system. A/D converters 1218 may be connected to processor 1224 by way of data bus 1242, through which representations of electrical signals may be transmitted to processor 1224. In various embodiments, the representations of electrical parameters may represent parameters, such as currents, voltages, frequencies, phases, and other parameters associated with an electric power distribution system. Sensor elements 1202*a-c* may represent a variety of types of elements, such as voltage transformers, current transformers, status inputs, a breaker controller, etc. Sensor component 1210 may be configured to receive digitized analog signals from merging units, which need little if any additional filtering, sampling, or processing before use by the processor 1224.

Processor 1224 may be configured to process communications received via communications interface 1216, monitored equipment interface 1208, local communications interface 1206, and/or sensor component 1210. Processor 1224 may operate using any number of processing rates and architectures. Processor 1224 may be configured to perform various algorithms and calculations described herein. Processor 1224 may be embodied as a general-purpose integrated circuit, an application specific integrated circuit, a field-programmable gate array, and/or any other suitable programmable logic device. In some embodiments, the processor 1224 may be generally referred to as processing circuitry.

A generator monitoring subsystem 1236 may be configured to monitor the generator using measured values (currents, voltages, etc.) and/or values received over communications. In particular, the generator monitoring subsystem may determine a rotor turn-to-turn fault condition in accordance with the several embodiments described herein.

A tripping subsystem 1232 may be configured to issue a trip command based upon determination of the rotor turn-to-turn fault condition. In various embodiments, the tripping subsystem 1232 may be in communication with a breaker, recloser, merging unit, or other device that may be configured to interrupt an electrical connection between the generator and an electric power generation and transmission system.

In various embodiments, the tripping subsystem 1232 may issue trip commands via an electrical or electromechanical interrupter, such as output circuitry 1233. In some embodiments, IED 1200 may be configured to issue trip commands upon detection of the rotor turn-to-turn fault condition or other protection elements. In various embodiments the IED 1200 may be configured to communicate the determined rotor turn-to-turn fault condition to other systems, and/or communicate to other systems that a trip command has been issued.

The above description provides numerous specific details for a thorough understanding of the embodiments described herein. However, those of skill in the art will recognize that one or more of the specific details may be omitted, or other methods, components, or materials may be used. In some cases, operations are not shown or described in detail. While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed:

1. A device for protecting an electric power generator for generating electrical energy for an electric power delivery system using a stator and a rotor, the device comprising;
   a sensor component in electrical communication with an instrument transformer of the generator, the sensor component including a current signal output for providing current signals corresponding with the instrument transformer of the generator;
   a processor;

a computer-readable storage medium in communication with the processor and the sensor component, comprising instructions that when executed by the processor cause the device to:
calculate a fractional harmonic of the signal output using the current signals as a circulating current magnitude at the fractional harmonic by:
calculating filter coefficients using a number of pole pairs of the rotor, a number of samples per cycle at a fundamental frequency, and a number of branches per phase of the stator, and;
calculating a circulating current magnitude using the filter coefficients;
compare the fractional harmonic to a predetermined threshold;
determine a rotor fault condition when the fractional harmonic exceeds the predetermined threshold for a predetermined time; and,
determine a protective action when the rotor fault condition is determined; and,
an output in communication with the computer-readable storage medium for effecting the determined protective action.

2. The device of claim 1, wherein the instrument transformer is associated with a parallel branch of a single phase of the electric power generator.

3. The device of claim 1, wherein the sensor component is in electrical communication with a plurality of instrument transformers of the generator and the sensor current signal output for providing current signals corresponding with the instrument transformers of the generator.

4. The device of claim 3, wherein:
the generator comprises a multiple-phase generator;
the stator comprises a plurality of parallel branches for each phase; and
the current signal output comprises current signals from the parallel branches for each phase.

5. The system of claim 4, wherein the fractional harmonic comprises the circulating current magnitude of the plurality of parallel branches at the first fractional harmonic for one phase of the multiple phases.

6. The system of claim 1, wherein the fractional harmonic comprises the circulating current magnitude of a plurality of parallel branches at a first fractional harmonic.

7. The system of claim 6, wherein the generator monitoring subsystem is configured to calculate the circulating current magnitude of the plurality of parallel branches using a finite impulse response filter.

8. The system of claim 7, wherein the finite impulse response filter comprises a cosine filter with coefficients calculated as:

$$b_n = \frac{\sqrt{2}}{H * SPC} * \cos\left(2\pi * \frac{1}{H} * \frac{g}{SPC}\right)$$

where:
$b_n$ represents filter coefficients;

$$g = \{1, 2, \ldots, H * SPC\} - 0.5$$

$$H = 2 * \left(\frac{P}{NBR}\right)$$

P represents the number of pole pairs of the rotor;
SPC represents the number of samples per cycle at a fundamental frequency; and,
NBR represents the number of branches per phase of the stator.

9. The system of claim 1, wherein the current signal comprises a current through a generator neutral grounding transformer.

10. The system of claim 1, wherein the current signal comprises a current through a secondary of a generator neutral grounding transformer.

11. The system of claim 1, wherein the current signal comprises a stator branch neutral signal.

12. The system of claim 1, wherein the rotor fault condition comprises a rotor turn-to-turn fault.

13. The system of claim 1, wherein the rotor fault condition comprises a rotor double-point-to-ground fault.

14. The system of claim 1, wherein the rotor fault condition comprises a rotor permanent magnet fault condition.

15. A method of detecting a rotor fault condition using available electric power signals from an electric power generator with a rotor and a stator, the method comprising:
receiving a current signal proportional to a current in a phase branch of the stator of the electric power generator;
calculating a fractional harmonic of the current signal as a circulating current magnitude at the fractional harmonic by:
calculating filter coefficients using a number of pole pairs of the rotor, a number of samples per cycle at a fundamental frequency, and a number of branches per phase of the stator, and;
calculating a circulating current magnitude using the filter coefficients;
comparing the fractional harmonic to a predetermined threshold;
determining a rotor fault condition when the fractional harmonic exceeds the predetermined threshold for a predetermined time;
determining a protective action when the rotor fault condition is determined; and,
effecting the determined protective action.

16. The method of claim 15, wherein the current signal comprises a plurality of current signals proportional to a plurality of currents in a plurality of phase branches of the stator of the electric power generator.

17. The method of claim 16, wherein the fractional harmonic comprises the circulating current magnitude at a first fractional harmonic.

18. A device for protecting an electric power generator for generating electrical energy for an electric power delivery system using a stator and a rotor, the device comprising;
a sensor component in electrical communication with an instrument transformer of the generator, the sensor component including a voltage signal output for providing voltage signals corresponding with the instrument transformer of the generator;
a processor;
a computer-readable storage medium in communication with the processor and the sensor component, comprising instructions that when executed by the processor cause the device to:
calculate a fractional harmonic of the signal output using the voltage signals as a circulating current magnitude at the fractional harmonic by:
calculating filter coefficients using a number of pole pairs of the rotor, a number of samples per cycle at a fundamental frequency, and a number of branches per phase of the stator, and;

calculating a circulating current magnitude using the filter coefficients;

compare the fractional harmonic to a predetermined threshold;

determine a rotor fault condition when the fractional harmonic exceeds the predetermined threshold for a predetermined time; and, determine a protective action when the rotor fault condition is determined; and, an output in communication with the computer-readable storage medium for effecting the determined protective action.

19. The device of claim 18, wherein the voltage signal comprises a generator neutral voltage.

20. The device of claim 19, wherein the instrument transformer comprises a neutral grounding transformer.

* * * * *